United States Patent [19]

Inoue et al.

[11] Patent Number: 5,581,584

[45] Date of Patent: Dec. 3, 1996

[54] PLL CIRCUIT

[75] Inventors: Atsushi Inoue; Toshio Hata; Osamu Tamakoshi; Takayasu Komaki, all of Kyoto, Japan

[73] Assignee: Murata Manufacturing Co., Ltd., Japan

[21] Appl. No.: 277,951

[22] Filed: Jul. 20, 1994

[30] Foreign Application Priority Data

Jul. 26, 1993 [JP] Japan ..................... 5-040653

[51] Int. Cl.$^6$ ..................................... H03D 3/24
[52] U.S. Cl. ............................. 375/376; 331/34
[58] Field of Search ..................... 375/120, 119, 375/118; 331/1 A, 17, 25, 1 R, 18, 34, 36 R, 36 C, 36 L, 117 FE; 327/141, 155, 156, 159, 162, 163

[56] References Cited

U.S. PATENT DOCUMENTS 5,218,325  6/1993  Trelewicz et al. ............... 331/117 FE

*Primary Examiner*—Stephen Chin
*Assistant Examiner*—Huong Luu
*Attorney, Agent, or Firm*—Ostrolenk, Faber, Gerb & Soffen, LLP

[57] ABSTRACT

A PLL circuit includes a PLLic formed into an integrated circuit; a loop filter for receiving an output signal from the PLLic; a voltage-controlled oscillator having an oscillation frequency which is controlled according to an output signal of the loop filter for applying a controlled oscillation output signal to the PLLic, the voltage-controlled oscillator including a resonator and a negative resistor circuit; wherein a buffer amplifier functioning as a part of the voltage-controlled oscillator is incorporated into the PLLic, and the resonator and the negative resistor circuit of the voltage-controlled oscillator are disposed outside of the PLLic.

12 Claims, 2 Drawing Sheets

PLL CIRCUIT

BACKGROUND OF THE INVENTION

1. Field of the Invention

This invention relates to a PLL (phase-Locked Loop) circuit, and more particularly, to a PLL circuit adapted for use in frequency synthesizers communication equipment, or the like.

2. Description of the Related Art

FIG. 5 is a diagram showing the configuration of a conventional frequency synthesizer using a PLL circuit. In the figure, reference numeral 20 designates a PLLic (Phase-Locked Loop Integrated Circuit). The PLLic 20 has a prescaler, a programmable divider, a phase comparator, a charge pump, and the like, which are not shown, formed on a single chip. The phase comparator receives a reference frequency signal fr. Reference numeral 30 designates a loop filter (low-pass filter) for removing high-frequency components and noise components from the output signal of the PLLic 20. A voltage-controlled oscillator 40 (VCO) has an oscillation frequency that is controlled according to the output signal of the loop filter 30. An impedance matching circuit 50 provides impedance matching with a downstream circuit. The output signal of the impedance matching circuit 50 is applied to PLLic 20.

Referring to FIG. 6, voltage-controlled oscillator 40 includes a resonator circuit 42, a negative resistor circuit 44, and a buffer amplifier 46.

Downsizing of such a PLL circuit would be desirable. Since the shape of the integrated circuit cannot be modified, the loop filter 30 and the voltage-controlled oscillator 40 are expected to be downsized. However, there is a limitation on the simplification of the design of elements forming the circuit because the various conventioned characteristics of the circuit need to be maintained. There is also a limitation on the downsizing of individual elements forming the circuit. As a result, downsizing of the PLL circuit is extremely difficult.

Further, in the processing of high frequencies, the wiring on the circuit becomes a source of inductance components, which deteriorates the circuit characteristics. Therefore, consideration must be given to minimizing the inductance components between the voltage-controlled oscillator 40 and the PLLic 20. However, where the terminals of the PLLic 20 are predetermined, this in turn determines the positional relationship between the PLLic 20 and the voltage-controlled oscillator 40. This means that freedom in designing the circuit is limited, which gives a restriction in the reduction of the inductance components.

In general, characteristics of the voltage-controlled oscillator are largely determined by the resonator circuit and the negative resistor circuit. If these two circuits are included in the PLLic, the characteristics of the voltage-controlled oscillator become inferior due to the structure of the IC. Further in such a case, an excellent discrete components such as a piezoelectric resonator can not be used as a part of the resonator circuit.

SUMMARY OF THE INVENTION

The present invention has been made in view of the above circumstances. Accordingly, an object of the invention is to downsize a PLL circuit with the characteristics thereof maintained.

To achieve the above object, according to the invention, there is provided a PLL circuit which comprises: a PLLic, a loop filter that receives an output signal of the PLLic, and a voltage-controlled oscillator that has an oscillation frequency controlled by an output signal of the loop filter and applies the controlled oscillation output signal to the PLLic, wherein the voltage-controlled oscillator includes a resonator and a negative resistor circuit; the PLLic includes the buffer amplifier of the voltage-controlled oscillator therein and is formed into an integrated circuit; and the resonator and the negative resistor circuit of the voltage-controlled oscillator are disposed outside of the PLLic.

According to the above configuration, in which the buffer amplifier of the voltage-controlled oscillator is incorporated in the integrated circuit of the PLLic, there is no need that the buffer amplifier be arranged in the voltage-controlled oscillator as a discrete part as in the conventional example. Therefore, not only a cost reduction corresponding to the elimination of the buffer amplifier part can be achieved, but also a large-scale downsizing of the PLL circuit as a whole can be implemented. Further, since the resonator and negative resistor circuits of the voltage-controlled oscillator are disposed outside of the PLLic, the resonator and negative resistor circuits, which can be assembled by using an efficient single transistor, varactor diode, capacitor and the like, become less affected by the noise derived from the integrated circuit, which in turn allows a PLL circuit with stable characteristics to be achieved.

The above and other objects and features of the present invention will be more apparent from the following description taken in conjunction with the accompanying drawings.

DETAILED DESCRIPTION OF THE PREFERRED EMBODIMENTS

Embodiments of the invention will now be described in detail with reference to the drawings.

Figure 1:
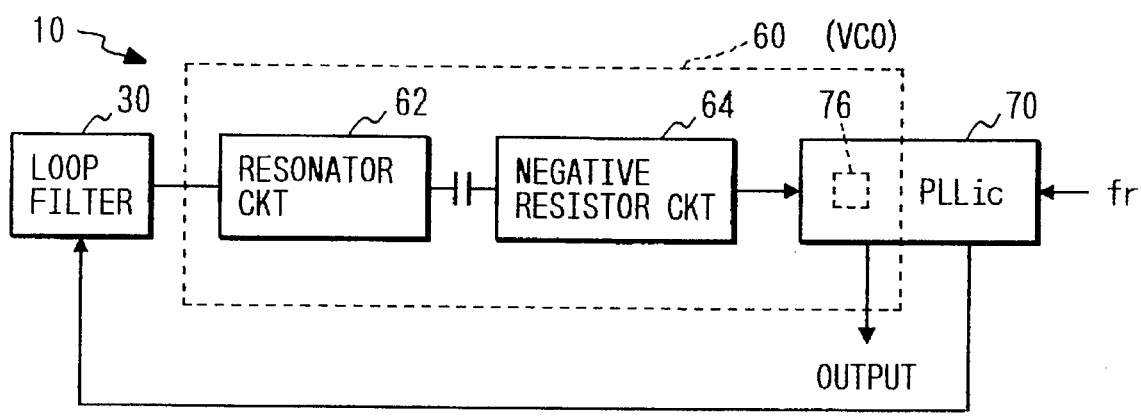
FIG. 1 is a block diagram showing a PLL circuit according to the invention.
Figure 5:
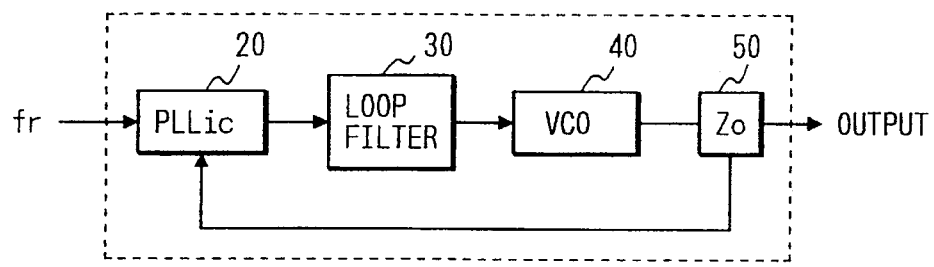
FIG. 5 is a block diagram showing a conventional PLL circuit.
Figure 6:
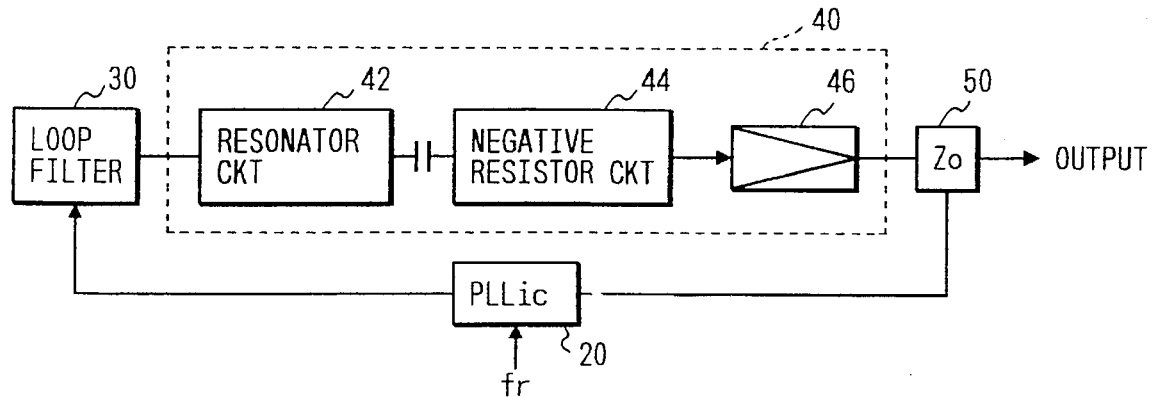
FIG. 6 is a block diagram showing a configuration of a conventional voltage-controlled oscillator.

FIG. 1 is a block diagram of a PLL frequency synthesizer, which is a PLL circuit according to a embodiment of the invention. Parts and components thereof corresponding to those of the conventional example shown in FIGS. 5 and 6 are designated by the same reference numerals.

In FIG. 1, a PLL frequency synthesizer 10 includes a PLLic 70, a loop filter (low-pass filter) 30 for removing high-frequency components and noise components from the output signal of the PLLic 70, and a voltage-controlled oscillator (VCO) 60 whose oscillation frequency is controlled by the output signal of the loop filter 30. The voltage-controlled oscillator 60 includes a resonator circuit 62, a negative resistor circuit 64, and a buffer amplifier 76. A reference frequency fr is applied to the PLLic 70.

In the invention, to downsize the PLL frequency synthesizer 10, the buffer amplifier 76 functioning as a part of the voltage-controlled oscillator 60 is incorporated into the PLLic 70.

Figure 2:
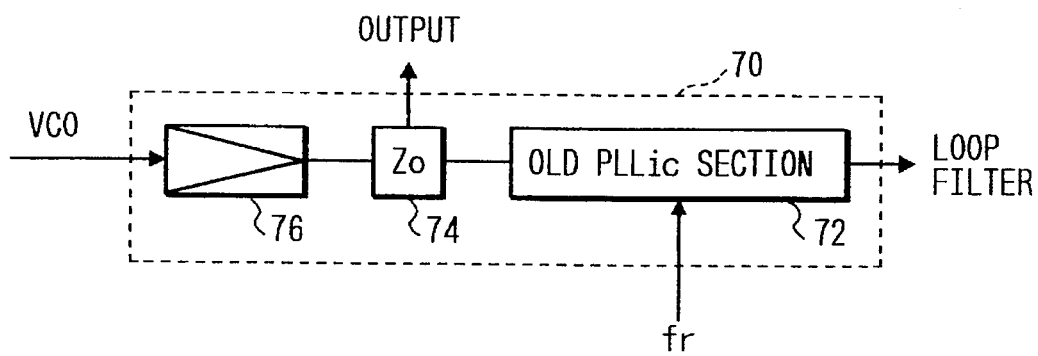
FIG. 2 is a block diagram showing a PLLic according to one embodiment of the invention.

FIG. 2 is a block diagram showing a PLLic 70 according to an embodiment of the invention. In this embodiment, the PLLic 70 includes a buffer amplifier 76 functioning as a part of a voltage-controlled oscillator 60 and an impedance matching circuit 74 that optimizes the output level of the buffer amplifier 76 therein. The output signal of the buffer amplifier 76 is drawn out from the PLLic 70 through the impedance matching circuit 74 and concurrently applied to a prescaler (not shown) of a PLLic 72 whose configuration is similar to that of the conventional example (hereinafter referred to as "old PLLic section"). The output signal of the old PLLic section is delivered to a loop filter 30.

Since the buffer amplifier 76 functioning as a part of the voltage-controlled oscillator 60 is incorporated into the PLLic 70 as described above, it is no longer necessary to arrange the buffer amplifier of the voltage-controlled oscillator 60 as a discrete part as in the conventional example. Therefore, not only a cost reduction corresponding to the elimination of the buffer amplifier part, but also a large-scale downsizing of the PLL frequency synthesizer can be achieved.

In addition, the synthesizer of this embodiment can reduce inductance components to a greater degree, compared with the conventional example in which the buffer amplifier 76 functioning as a part of the voltage-controlled oscillator 60 and the PLLic 72 are connected externally, which further contributes to improving the noise characteristic of the synthesizer.

Still further, the resonator circuit 62 and the negative resistor circuit 64 of the voltage-controlled oscillator 60, which affect various characteristics of the PLL frequency synthesizer 10, are disposed outside of the PLLic 70 so as to be better isolated from noise or the like produced at the PLLic 70. These circuits are not subjected to restriction of performance which is applied to circuit components constituting an IC, and can use an efficient discrete part such as a piezoelectric resonator, a transistor, a varactor diode and a capacitor. As a result, such satisfactory characteristics as those of the conventional example can be maintained.

Figure 3:
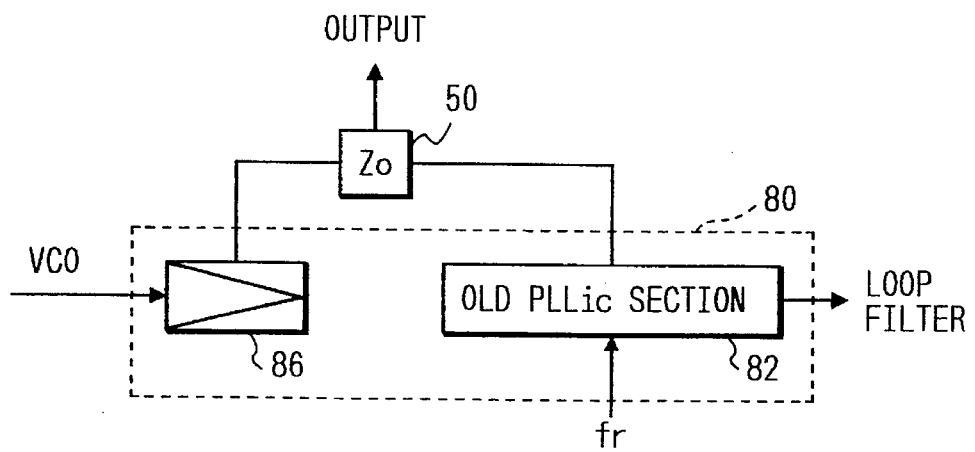
FIG. 3 is a block diagram showing a PLLic according to another embodiment of the invention.

FIG. 3 is a block diagram showing a PLLic according to another embodiment of the invention.

In this embodiment, the PLLic 80 is so designed as to incorporate therein a buffer amplifier 86 functioning as a part of a voltage-controlled oscillator 60. The output signal of the buffer amplifier 86 is applied through an impedance matching circuit 50 disposed outside of the PLLic 80 to the exterior, and also delivered to the prescaler of an old PLLic section 82. Other configurational aspects of this embodiment are similar to those of the above embodiment.

Figure 4:
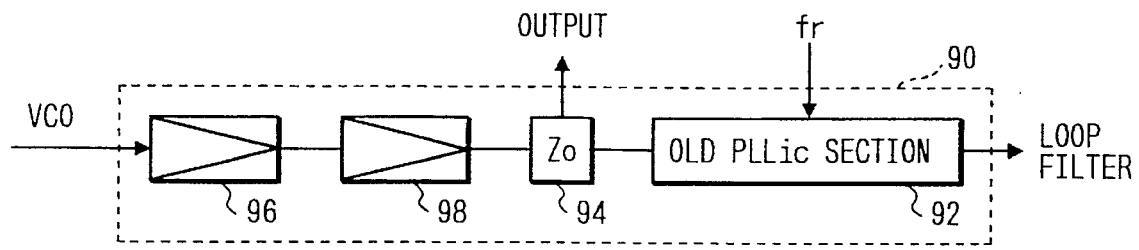
FIG. 4 is a block diagram showing a PLLic according to still another embodiment of the invention.

FIG. 4 is a block diagram showing a PLLic according to still another embodiment of the invention.

In this embodiment, the PLLic 90 incorporates thereinto buffer amplifiers 96 and 98 functioning as a part of a voltage-controlled oscillator 60 and an impedance matching circuit 94. The buffer amplifiers 76 and 78 are formed in two stages. By thus forming the buffer amplifiers 76 and 78 in two stages, gain, isolation and the like can be improved.

The number of stages in which the buffer amplifiers are arranged is not limited to or by two. Buffer amplifiers may be arranged in more stages in still another embodiment of the invention.

As was described in the foregoing, according to the invention, the buffer amplifier(s) functioning as a part of the voltage-controlled oscillator is incorporated into the integrated circuit of the PLLic. Therefore, there is no need to provide the buffer amplifier(s) of the voltage-controlled oscillator as discrete part(s) as in the conventional example. This contributes not only to a cost reduction corresponding to the elimination of the buffer amplifier part(s), but also possibly to a large-scale downsizing of the PLL circuit as a whole. In addition, according to the invention, the resonator and negative resistor circuits of the voltage-controlled oscillator are disposed outside of the PLLic. Therefore, a PLL circuit with stable characteristics can be achieved.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A phase-locked loop circuit, comprising:
 a phase-locked loop integrated circuit adapted for having a reference frequency inputted thereto, said phase-locked loop integrated circuit having a buffer amplifier physically incorporated therein;
 a loop filter for receiving an output signal from said phase-locked loop integrated circuit;
 a voltage-controlled oscillator having an oscillation frequency which is controlled according to an output signal of said loop filter for supplying a controlled oscillation output signal,
 said voltage-controlled oscillator including a resonator, a negative resistor circuit, and said buffer amplifier in said phase-locked loop integrated circuit,
 said voltage-controlled oscillator supplying said controlled oscillation output signal to further components in said phase-locked loop integrated circuit downstream from said buffer amplifier.

2. A phase-locked loop circuit as claimed in claim 1, further comprising an impedance matching circuit for optimizing an output level of said buffer amplifier, said impedance matching circuit being physically incorporated into said phase-locked loop integrated circuit.

3. A phase-locked loop circuit as claimed in claim 1, further comprising an impedance matching circuit disposed outside of said phase-locked loop integrated circuit for optimizing an output level of said buffer amplifier incorporated into said phase-locked loop integrated circuit.

4. A phase-locked loop circuit as claimed in claim 1, wherein said buffer amplifier comprises a plurality of individual buffer amplifiers connected in series with each other.

5. A phase-locked loop circuit as claimed in claim 1, wherein said loop filter comprises a low-pass filter.

6. A phase-locked loop circuit as claimed in claim 4, wherein said plurality of individual buffer amplifiers is a pair of individual buffer amplifiers.

7. In a phase-locked loop circuit, comprising:
 a phase-locked loop integrated circuit adapted for having a reference frequency inputted thereto;
 a loop filter for receiving an output signal from said phase-locked loop integrated circuit; and a voltage-controlled oscillator having an oscillation frequency which is controlled according to an output signal of said loop filter for supplying a controlled oscillation output signal, said voltage-controlled oscillator including a resonator, a negative resistor circuit, and a buffer amplifier; the improvement comprising:

said phase-locked loop integrated circuit having said buffer amplifier physically incorporated therein;

said voltage-controlled oscillator supplying said controlled oscillation output signal to further components in said phase-locked loop integrated circuit downstream from said buffer amplifier.

8. A phase-locked loop circuit as claimed in claim 7, further comprising an impedance matching circuit for optimizing an output level of said buffer amplifier, said impedance matching circuit being physically incorporated into said phase-locked loop integrated circuit.

9. A phase-locked loop circuit as claimed in claim 7, further comprising an impedance matching circuit disposed outside of said phase-locked loop integrated circuit for optimizing an output level of said buffer amplifier incorporated into said phase-locked loop integrated circuit.

10. A phase-locked loop circuit as claimed in claim 7, wherein said buffer amplifier comprises a plurality of individual buffer amplifiers connected in series with each other.

11. A phase-locked loop circuit as claimed in claim 10, wherein said plurality of individual buffer amplifiers is a pair of individual buffer amplifiers.

12. A phase-locked loop circuit as claimed in claim 7, wherein said loop filter comprises a low-pass filter.

* * * * *